United States Patent [19]

Obinata

[11] Patent Number: 4,963,870
[45] Date of Patent: Oct. 16, 1990

[54] DIGITAL TO ANALOG CONVERTER WITH COMPENSATION MEMORY ADDRESSED BY LOWER ORDER BITS

[75] Inventor: Hajime Obinata, Tokyo, Japan

[73] Assignee: Nakamichi Corporation, Tokyo, Japan

[21] Appl. No.: 425,572

[22] Filed: Oct. 23, 1989

[30] Foreign Application Priority Data

Oct. 27, 1988 [JP] Japan .................... 63-271889

[51] Int. Cl.⁵ .................................... H03M 1/06
[52] U.S. Cl. ........................... 341/118; 341/145
[58] Field of Search ............ 341/118, 119, 120, 121, 341/138, 140, 144, 145, 106

[56] References Cited

U.S. PATENT DOCUMENTS

| | | | |
|---|---|---|---|
| 4,316,178 | 2/1982 | Shibayama et al. | 341/118 |
| 4,340,882 | 7/1982 | Maio et al. | 341/118 |
| 4,503,421 | 3/1985 | Hareyama et al. | 341/145 |
| 4,523,182 | 6/1985 | Harvey et al. | 341/118 |
| 4,740,776 | 4/1988 | Sloane | 341/118 |
| 4,843,392 | 6/1989 | Gulczynski | 341/118 |

Primary Examiner—William M. Shoop, Jr.
Assistant Examiner—H. L. Williams
Attorney, Agent, or Firm—Dann, Dorfmann, Herrell and Skillman

[57] ABSTRACT

A digital/analog converting device comprises a first digital/analog converter for converting upper M bits of an input digital signal into a first analog signal; a memory for receiving, as address data, at least a digital signal of lower N bits of the input digital signal to output lower-bit-output-approximate data of S (S>N) bits in response to the address data; a second digital/analog converter for converting digital data at least including the S-bit lower-bit-output-approximate data into a second analog signal; and an analog adder for outputting an added analog signal obtained by adding the first and second analog signals at a predetermined ratio. The S-bit lower-bit-output-approximate data are set such that, supposing a level change of the added analog signal with respect to a change of an LSB of the upper M bits being $\Delta L$, a minimum step increase of the digital signal of lower N bits causes a level of the added analog signal to increase by about $\Delta L/2^N$.

4 Claims, 9 Drawing Sheets

DIGITAL TO ANALOG CONVERTER WITH COMPENSATION MEMORY ADDRESSED BY LOWER ORDER BITS

BACKGROUND OF THE INVENTION

1. Field of the Invention

This invention relates to a digital/analog converting device, and more particularly to a digital/analog converting device that employs a plurality of digital/analog converters to carry out conversion with high accuracy.

2. Description of the Prior Art

The digital/analog converting devices are employed in various equipment such as information communication and audio instruments. In recent years, the digital/analog converting devices are required to handle large bits for the following reasons.

The digital/analog converting device incorporated in a digital audio instrument such as a CD (compact disc) player and a DAT (digital audio taperecorder) basically comprises a 16 bit digital/analog converter (hereinafter referred to as DAC) and a low pass filter (hereinafter referred to as LPF). An output of DAC includes folding components with a carrier that is an integer multiple of a sampling frequency. To remove the folding components of DAC, LPF shall have steep damping characteristics. However, if the damping characteristics of LPF be too steep, it would result in increase of a ripple and deterioration of phase characteristics of a passband.

To cope with this problem, a digital filter for oversampling tends to be disposed before DAC. The digital filter equivalently increases a sampling frequency of a digital signal to be inputted to DAC to shift folding components of the digital signal toward a high-frequency side so that LPF may not be required to have an excessive degree of damping characteristics. Arranging the digital filter before DAC is known as very effective to reduce a load on LPF. However, it has a drawback that the number of bits of output data increases due to repetitive operation. If the number of bits converted by DAC is kept at 16, fractions of output data of the digital filter shall be discarded or rounded up or down with respect to a threshhold of five. Then, repeated quantization of errors of the rouding up/down cause many noises. Therefore, if the digital filter is disposed, it will be necessary to arrange a large-bit DAC to minimize such noises.

Figure 9:
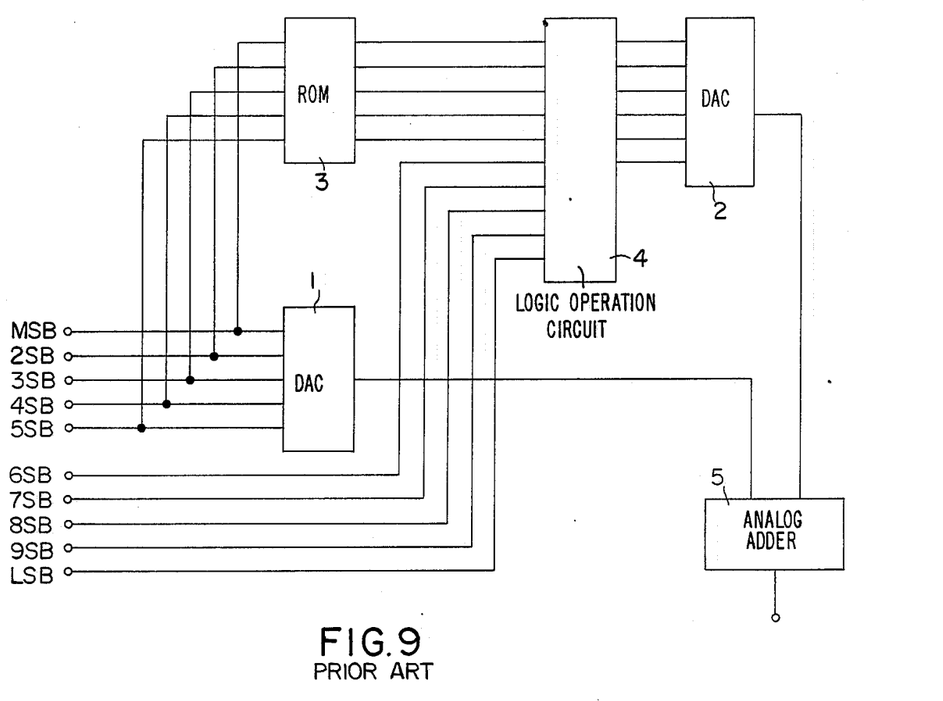
FIG. 9 is a block diagram showing a prior art digital-/analog converting device.

Generally, a weight resistance of DAC is trimmed to satisfy a nonlinear error of $\pm\frac{1}{2}$LSB (least significant bit). Even with this, the number of bits in the order of 16 is nearly a limit at present. A Japanese patent publication No. 55-36215 proposes a digital/analog converting device that employs a plurality of small bit DACs to realize digital/analog conversion equivalent to that of a large-bit DAC. As shown in FIG. 9 of the accompanying drawings, this prior art digital/analog converting device employs a 5 bit DAC 1 for upper 5 bits and a 6-bit DAC 2 for lower 5 bits and for 1 bit for correcting an output error of DAC 1, to achieve digital/analog conversion with 10-bit accuracy. This digital/analog converting device comprises a ROM (read only memory) 3 storing digital data for correcting the output error of DAC 1 with the use of DAC 2; a logic operation circuit 4 for adding digital data read out of ROM 3 in response to a digital signal of the upper 5 bits to a digital signal of the lower 5 bits; and an analog adder 5 for adding an analog output from DAC 1 to an analog output from DAC 2 at a ratio of 1:1. DACs 1 and 2 are selected such that an output of DAC 1 for an LSB is identical to an output of DAC 2 for an MSB (most significant bit). With such arrangement, an analog output converted by DAC 1 from the digital signal of upper 5 bits may contain an output error in the range of $\pm\frac{1}{2}$LSB, which, however, can be corrected by an analog output from DAC 2.

In the digital/analog converting device of the above-mentioned prior art, if an output (a theoretical value) of DAC 1 for an LSB is precisely identical to an output (a theoretical value) of DAC 2 for an MSB and if an adding ratio of the analog adder 5 is correctly 1:1 without an error, an output Va of the analog adder 5 for LSB of DAC 1 will at last be equal to an output Vb of the analog adder 5 for MSB of DAC 2. Then, an analog output from the adder 5 for the upper 5 bits of DAC 1 will be continuous to an analog output from the adder 5 for the lower 5 bits of DAC 2. Thus, required 10 bit digital/analog conversion is achieved.

In practice, however, due to a limited accuracy of the adding ratio of the analog adder 5, the outputs Va and Vb will not always be equal to each other. To cope with this, an output gain of DAC 1 or 2 shall be adjusted, or the adding ratio of the analog adder 5 shall be adjusted such that the outputs Va and Vb correctly agree with each other. However, such adjustment requires a strict accuracy and therefore is very hard to achieve. In addition a variable resistor employed for the adjustment is generally vulnerable to temperature changes and aging to degrade the digital/analog conversion. It may be considered to connect a plurality of fixed resistors in parallel to adjust the adding ratio of the analog adder 5, which is laborious and not proper for mass production.

SUMMARY OF THE INVENTION

It is therefore an object of the invention to provide a novel digital/analog converting device that can solve drawbacks of the prior art.

In accordance with an aspect of the invention there is provided a digital/analog converting device comprising a first digital/analog converter for converting upper M bits of an input digital signal into a first analog signal; storage means for receiving a digital signal of lower N bits of the input digital signal as address data and outputting lower-bit-output-approximate data of S (S>N) bits in response to the address data; a second digital/analog converter for converting digital data at least including the lower-bit-output-approximate data of S bits into a second analog signal; and analog adding means for adding the first analog signal to the second analog signal at a predetermined ratio to provide an added analog signal.

The lower-bit-output-approximate data of S bits outputted in response to the digital signal of the lower N bits are set such that, supposing a level change of the added analog signal with respect to a change of an LSB of the upper M bits being $\Delta L$, a minimum step increase of the digital signal of lower N bits causes a level of the added analog signal to increase by about $\Delta L/2^n$. Therefore, an analog output from the analog adding means for the upper M bits converted by the first digital/analog converter and an analog output from the analog adding means for the lower N bits converted by the second digital/analog converter will be continuous to each other to satisfactorily achieve digital/analog conversion of M+N bits.

BRIEF DESCRIPTION OF THE DRAWINGS

Further objects and advantages of the invention can be fully understood from the following description when read in conjunction with the accompanying drawings in which.

DETAILED DESCRIPTION OF THE EMBODIMENTS

The principles of a digital/analog converting device of the invention will be first explained with reference to FIGS. 4 and 9. For the sake of simplicity of comparison with the embodiment shown, a prior art device of FIG. 9 is supposed to convert input data of 20 bits into an analog signal, and conventional DACs 1 and 2 employed therein are supposed to be identical 16-bit DACs. Particularly, DAC 2 is supposed to receive upper 5 bits of the input data.

Figures 4A, 4B:
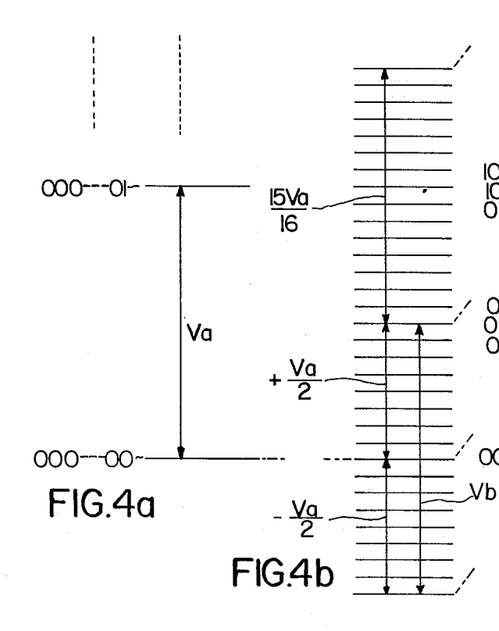
FIG. 4 is an explanatory view showing conversion principles of the invention.

An output step (a theoretical value) of an adder 5 with respect to upper 16 bits of the input data converted by DAC 1 is shown in FIG. 4(a). An interval of the output step is Va. An output step of the adder 5 with respect to 5 bits of the input data converted by DAC 2 is shown in FIG. 4(b). As shown in this figure, a width Va is necessary to correct an output error of less than $\pm Va/2$ to be generated in each output step of DAC 1, while a width $+15Va/16$ is necessary for lower 4 bits. Then, a maximum output width is $31Va/16$ which is a sum of the widths Va and $+15Va/16$. Therefore, the output step of the adder 5 with respect to the 5 bits of the input data converted by DAC 2 should be one that is obtainable by dividing the maximum output width $31Va/16$ by $2^5 - 1$. In addition, the analog output from the adder 5 for the upper 16 bits converted by DAC 1 and the analog output from the adder 5 for the lower 4 bits converted by DAC 2 should be continuous to achieve required digital/analog conversion of 20 bits. For this requirement, an output Va of the adder 5 for an LSB of DAC 1 should agree with an output Vb of the adder 5 for an MSB of DAC 2, and an adding ratio of the adder 5 should correctly be $1:2^{-15}$ because DACs 1 and 2 are the same 16-bit DACs.

Figure 4C:
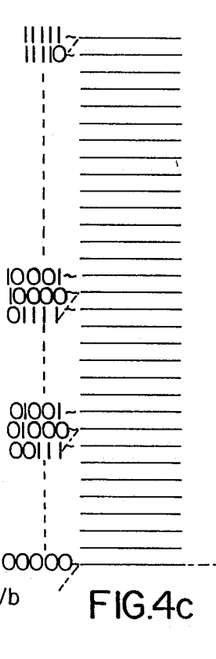

DAC 2 will by nature output a negative signal as well for correcting an output error of DAC 1. However, by offsetting by $+Va/2$ an output (a theoretical value) of the adder 5 for the upper 16 bits of input data converted by DAC 1, the output error of DAC 1 will always be of a negative value. In this case, as can be seen in FIG. 4(c), DAC 2 may output only a positive side relative to the output error. For example, if an output of the adder 5 for input data converted by DAC 1 has an error of $+Va/2$ relative to an original theoretical value, DAC 2 will provide no correction output. If an output of the adder 5 for the input data converted by DAC 1 has no error relative to the original theoretical value, DAC 2 provides a correction output corresponding to an output of $+Va/2$ of the adder 5. In this case, a DC offset of $+Va/2$ occurs in the output of the adder 5. However, if the input data are audio signals, the DC components are not needed so that the offset may easily be removed through a coupling capacitor to cause no problem.

An object of the invention is to enter the outputs Va and Vb into agreement with each other without necessity of adjusting the adding ratio of the adder 5. The principles adopted in this invention to achieve this object will now be explained.

Figure 4D:
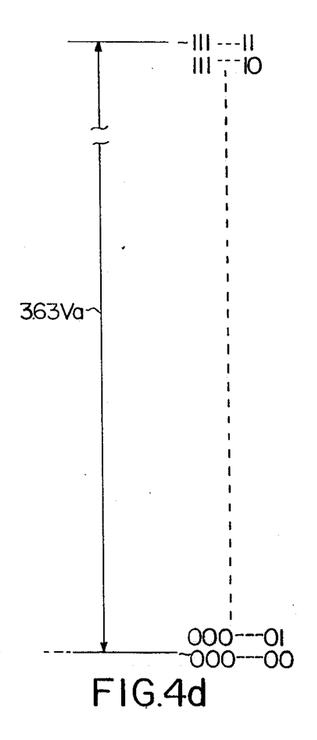

Suppose the adding ratio of the adder 5 is set to be properly larger than the ratio $1:2^{-15}$, for example about 1:1/18000, and the number of upper bits processed by DAC 2 is increased to, for instance, 9 bits. With this arrangement, as shown in FIG. 4(d), an output step of the adder 5 for 9 bits of input data converted by DAC 2 will be one that is obtainable by dividing a maximum output width of about 3.63Va by $2^9 - 1$. Therefore, even if the adding ratio of the adder 5 is not so accurate, there will be an output step that is approximate to each output step of FIG. 4(c). By obtaining the data of approximate output step (lower-bitoutput-approximate data to be described later) of FIG. 4(d) which is corresponding to the data of output step of FIG. 4 (c), adjustment of the analog adding ratio needed in the Prior art can be eliminated.

A digital/analog converting device of the present invention according to the above-mentioned principles will now be explained in detail with reference to a block diagram of FIG. 1 and a timing chart of FIG. 2. 20-bit serial data outputted from an 8-time over-sampling digital filter 10 are converted by a serial/parallel converter circuit 12 into 16-bit parallel data. More particularly, the serial/parallel converter circuit 12 will fetch the 20-bit serial data in synchronism with a rise of a shift clock SHIFT-CK$_1$ outputted from a clock control circuit 14, convert upper 16 bits (MSB to 16SB) in synchronism with a rise of a store clock STORE-CK into upper bit data (DN) of the 16-bit parallel data to be outputted therefrom. Then, the serial/parallel converter circuit 12 will fetch the remaining lower 4 bits (17SB to LSB) in synchronism with a rise of the shift clock SHIFT-CK$_1$, convert the lower 4-bit data in synchronism with the next rise of the store clock STORE-CK into lower bit data (DN+1) of the 16-bit parallel data to be outputted therefrom. When converting the lower 4- bit data, the serial/parallel converter circuit 12 outputs the converted data at positions of upper 4 bits of 16 bits and does not define the status of lower 12 bits.

The data outputted from the serial/parallel converter circuit 12 are passed through a latch circuit 18 and supplied to input terminals I$_1$ to I$_{16}$ of a parallel/serial converter circuit 24 as well as to address terminals A$_2$ to A$_{17}$ of a ROM 16. To an address terminal A$_1$ of ROM 16 is supplied an area signal S$_1$ from the clock control circuit 14.

ROM 16 reads out upper-bit-output-error-correcting data (Dn) of 8 bits written at an address specified by the area signal S$_1$ of "L" level and upper bit data (DN), and outputs the data (Dn) after read time T$_1$ to a latch circuit 20 and a logic operation circuit 22 in parallel. Then, a latch clock LATCH-CK from the clock control circuit 14 rises so that the latch circuits 18 and 20 store and hold the upper bit data (DN) and upper bit-output-error-correcting data (Dn), respectively. After that, ROM 16 reads out lower-bit-output-approximate data (Dn-1) of 8 bits written at an address specified by the area signal $S_1$ of "H" level and lower bit data (DN+1), and outputs the data (Dn+1) after read time $T_1$ to the latch circuit 20 and logic operation circuit 22 in parallel.

The logic operation circuit 22 digitally adds outputs of the latch circuit 20 and ROM 16 to each other to obtain 9-bit parallel data, and supplies the same after operation time $T_2$ to input terminals $I_1$ to $I_9$ of a parallel/serial converter circuit 26. Input terminals $I_{10}$ to $I_{16}$ of the parallel/serial converter circuit 26 are always at "L" level.

While the logic operation circuit 22 is outputting the added result of the upper-bit output-error-correcting data (Dn) and the lower-bit-output-approximate data (Dn+1), the clock control circuit 14 makes a level of a mode signal MODE to be "H". Responsive to the "H" level mode signal MODE, the parallel/serial converter circuit 24 fetches the upper bit data (DN), and the parallel/serial converter circuit 26 fetches the upper-bit-output-error-correcting data (Dn) plus lower-bit-output-approximate data (Dn+1). Then, the parallel/serial converter circuits 24 and 26 provide 16-bit serial outputs to DACs 28 and 30, respectively, after output time $T_3$ in synchronism with a of fall a shift clock SHIFT-$CK_2$.

DACs 28 and 30 fetches the 16-bit data in synchronism with a fall of the shift clock SHIFT-CK and convert the data into analog signals in synchronism with a rise of a conversion signal LE which is outputted after completion of the fetch of the data. The analog signals are outputted from DACs 28 and 30 in the form of currents, respectively, to an analog circuit portion 40. To realize the same thermal characteristics, DACs 28 and 30 are preferable to be a package DAC of two channels. By using upper 9 bits of a 16-bit DAC for DAC 30, It will be possible that a nonlinear output error of a 9-bit DAC is substantially eliminated, intervals of respective output steps are made uniform, and the measurement and operation of the lower-bit-output approximate data is reduced.

Figure 3:
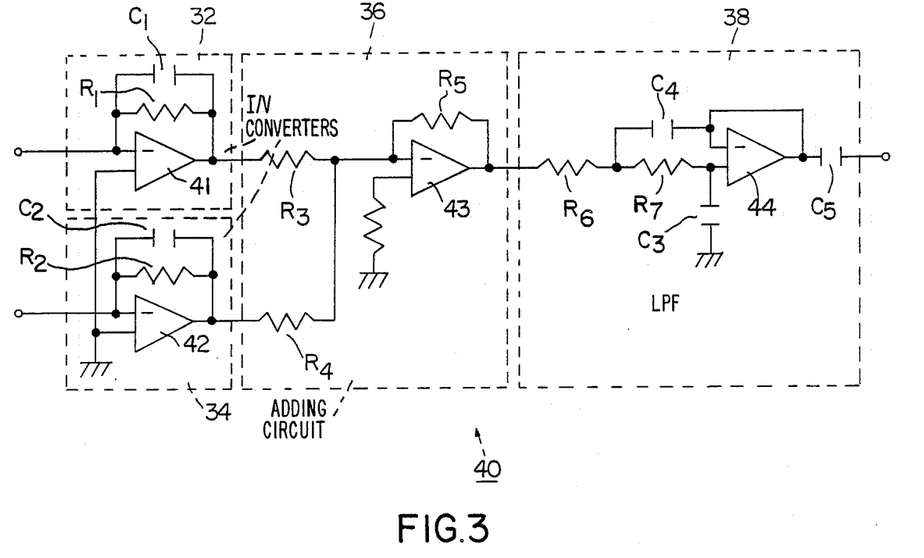
FIG. 3 is a circuit diagram showing the details of an analog circuit portion of the embodiment.

The analog circuit portion 40 comprises I/V converters 32 and 34 for converting current outputs of DACs 28 and 30 into voltages, respectively, and acting as primary LPFs; an adding circuit 36 for adding outputs from the I/V converters 32 and 34 to each other; and a secondary LPF 38. The I/V converter 32 comprises an operational amplifier 41, a negative feedback resistor $R_1$ of 1.8kΩ and a capacitor $C_1$ of 0.0015μ. The I/V converter 34 likewise comprises an operational amplifier 42, a negative feedback resistor $R_2$ of 1kΩ and a capacitor $C_2$ of 2.7μ. The I/V converters 32 and 34 attenuate high frequency regions of the respective current outputs of DAC 28 and 30 with predetermined filtering characteristics and convert them into voltages at a ratio of about 1:1/1800. The adding circuit 36 which comprises an operational amplifier 43, an input resistor $R_3$ of 1 kΩ, another input resistor $R_4$ of 10 kΩ and a negative feedback resistor $R_5$ of 1 kΩ, will add output voltages of the I/V converters 32 and 34 to each other at a ratio of about 1:1/10. LPF 38 comprises an operational amplifier 44, resistors $R_6$ and $R_7$ and capacitors $C_3$ and $C_4$ to form a known secondary active filter for attenuating a high frequency region of an output signal of the adding circuit 36 with predetermined filtering characteristics. A capacitor $C_5$ disposed at an output of the operational amplifier 44 will eliminate a DC offset which appears because DACs 28 and 30 are formed from one polarity DACs as described before. In such arrangement, the analog circuit portion 40 adds the current outputs of DACs 28 and 30 to each other at a ratio of about 1:18000 and, at the same time, removes folding components with the three-stage filtering characteristics and eliminates the DC offset.

How to obtain the upper-bit-output-error-correcting data and lower bit-output-approximate data written in ROM 16 will now be explained by way of example.

(1) Upper-bit output-error-correcting data

The input terminals $I_1$ to $I_{16}$ of the parallel/serial converter circuit 26 are all set to be at "L" level and then the input terminals $I_1$ to $I_{16}$ of the parallel serial converter circuit 24 are sequentially set at "H" level one by one, so that outputs of the adding circuit 36 at the respective points are measured with high accuracy. Differences between the measurement results and corresponding theoretical outputs will be considered as output errors of respective bits of DAC 28. Based on the output errors thus found, output errors of DAC 28 with respect to upper 16 bits (MSB to 16SB) of input data are determined. The output errors can otherwise be determined by changing input data to DAC 28 from a minimum value to a maximum value to measure outputs of the adding circuit 36 for the respective input data. The upper bit output-error-correcting data thus determined for inputting to DAC 30 are stored in ROM 16 at addresses specified by the area signal $S_1$ of "L" level and the upper 16 bits of 20-bit input data.

(2) Lower-bit-output-approximate data

The input terminals $I_1$ to $I_{16}$ of the parallel/serial converter circuit 24 are all set to be at "L" level and then only the input terminal $I_1$ of the parallel/serial converter circuit 26 is set to be at "H" level to provide 16-bit test data of "1000 . . . 0". An output Vb of the adding circuit 36 corresponding to an output of DAC 30 based on the test data is measure with high precision. The test data "1000 . . . 0" are multiplied by Va/Vb' to provide upper 16-bit data that will be conversion data for outputting the theoretical output Va from DAC 30. Data of respective steps derived by dividing 2SB to 9SB of the conversion data each by $2^4 - 1$ will be the lower-bit-output-approximate data for obtaining theoretical outputs of lower 4 bits of the 20-bit input data, which are written in ROM 16 at addresses specified by the area signal $S_1$ of "H" level and the lower 4 bits of the 20-bit input data. As having been described, when the lower 4-bit data from the serial/Parallel converter circuit 12 are converted into 16-bit parallel data, the status of lower 12 bits is not specified, so that if the addresses of upper 5 bits are the same, the same lower-bit-output-approximate data are written in ROM 16 at addresses "1000 . . . 0" to "1111 . . . 1" irrespective of the addresses of lower 12 bits.

The upper-bit-output-error-correcting data and the lower-bit-output-approximate data thus obtained are written at predetermined addresses in ROM 16, whereupon the digital/analog converting device is ready for operation. The above-mentioned measurement, operation and ROM writing proceedings will be automated with the use of analog/digital converters and personal computers, for example.

FIGS. 5 through 8 illustrates different embodiments of the present invention. Components identical to those of the first embodiment shown in FIG. 1 are represented with like reference numerals to omit their repetitive explanations.

Figure 1:
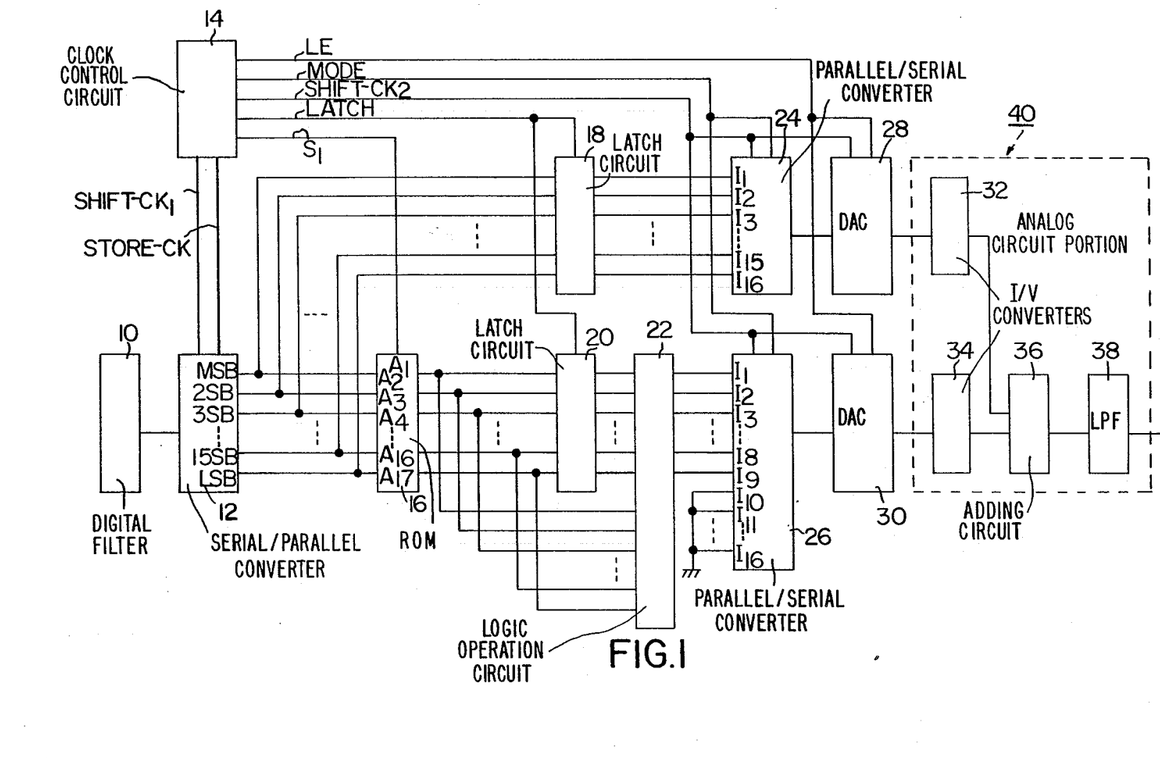
FIG. 1 is a block diagram showing a digital/analog converting device according to an embodiment of the invention.
Figure 2:
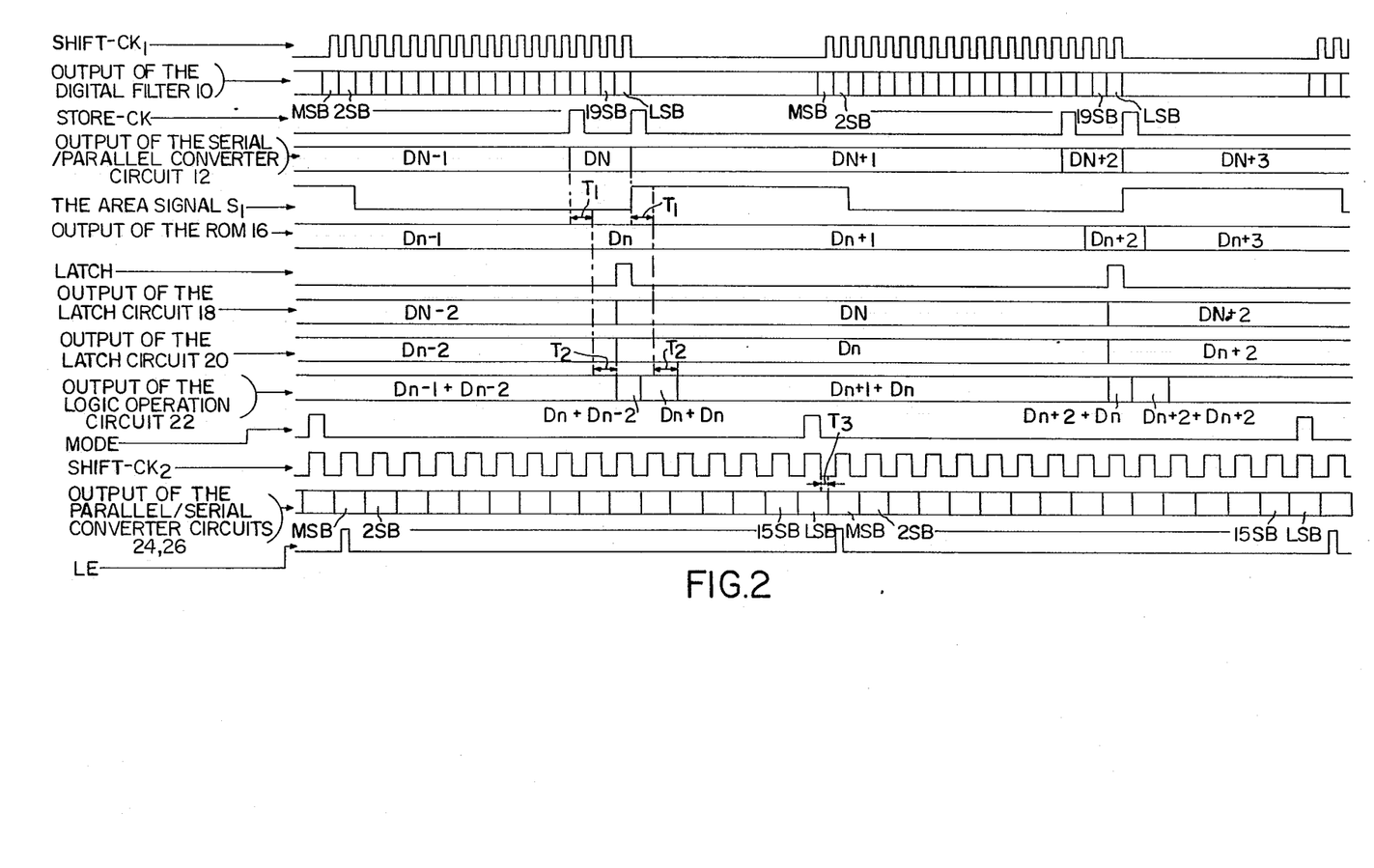
FIG. 2 is a timing chart showing various signals of the embodiment.
Figure 5:
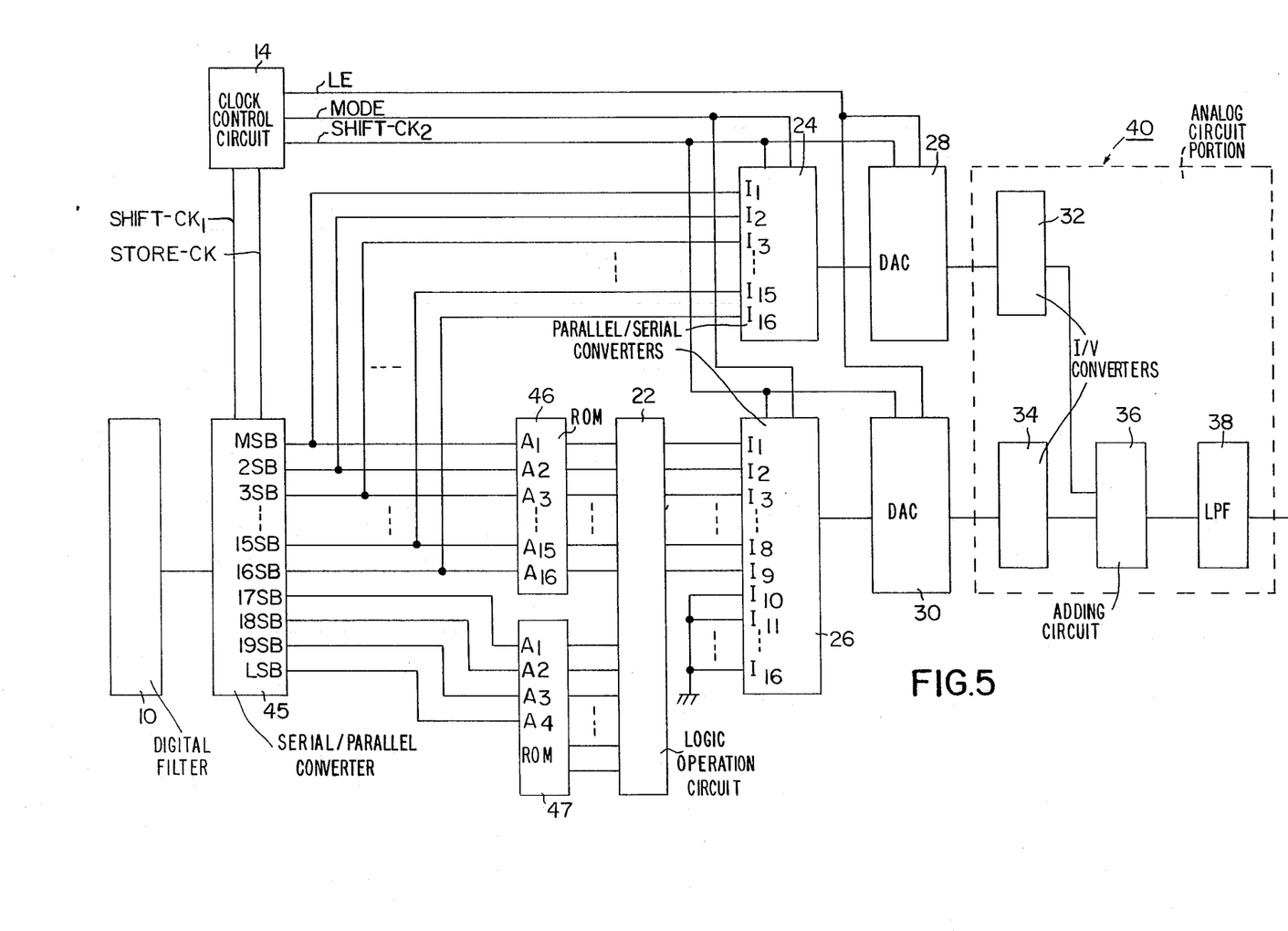
FIGS. 5 to 8 are block diagrams showing digital-/analog converting devices according to different embodiments of the invention, respectively.

In the digital/analog converting device shown in FIG. 5, separate ROMs 46 and 47 are employed to store the upper-bit-output error correcting data and the lower-bit output-approximate data, respectively, which is different from the first embodiment shown in FIG. 1 wherein a single ROM 16 is utilized for storing and supplying these data in response to the area signal $S_1$ at its different levels. A serial/parallel converter 45 converts 20-bit input data (MSB to LSB) into parallel data at a time and supplies upper 16 bits (MSB to 16SB) of the converted data to input terminals $I_1$ to $I_{16}$ of a parallel/serial converter circuit 24 and addresses $A_1$ to $A_{16}$ of ROM 46 respectively, the remaining lower 4 bits (17SB to LSB) being supplied to addresses $A_1$ to $A_4$ of ROM 47.

Figure 6:
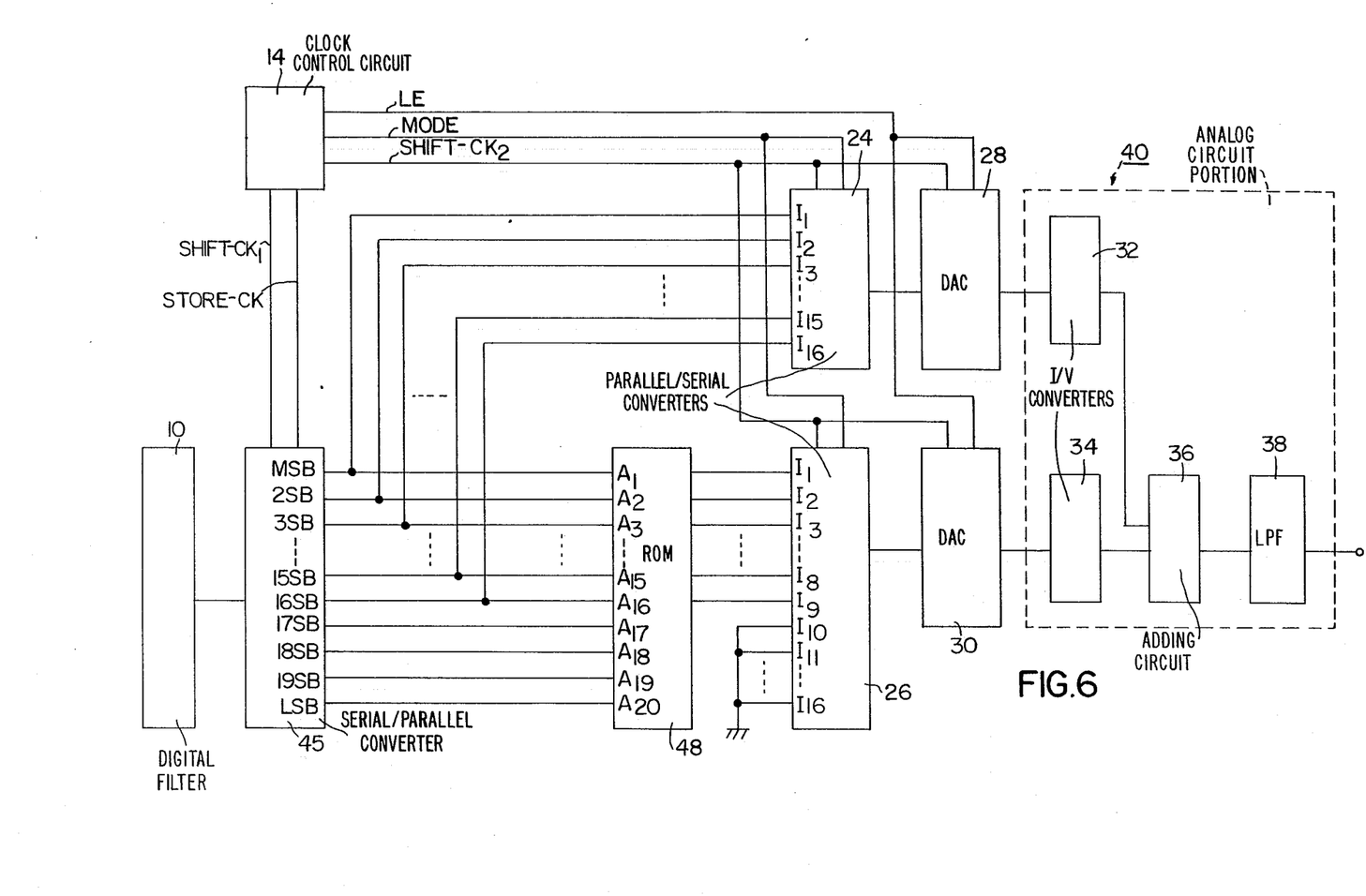

FIG. 6 shows an improvement of the digital/analog converting device of FIG. 5. In FIG. 5, ROMs 46 and 47 have been disposed to store the upper-bit-output-error-correcting data and the lower-bit-output-approximate data, respectively. In FIG. 6, however, a single ROM 48 is disposed to store input data that are supplied to a DAC 30, which then provides correcting data to an adding circuit 36. As a result, the adding circuit 36 outputs theoretical values corresponding to a 20-bit digital signal supplied by a serial/parallel converter 45.

Figure 7:
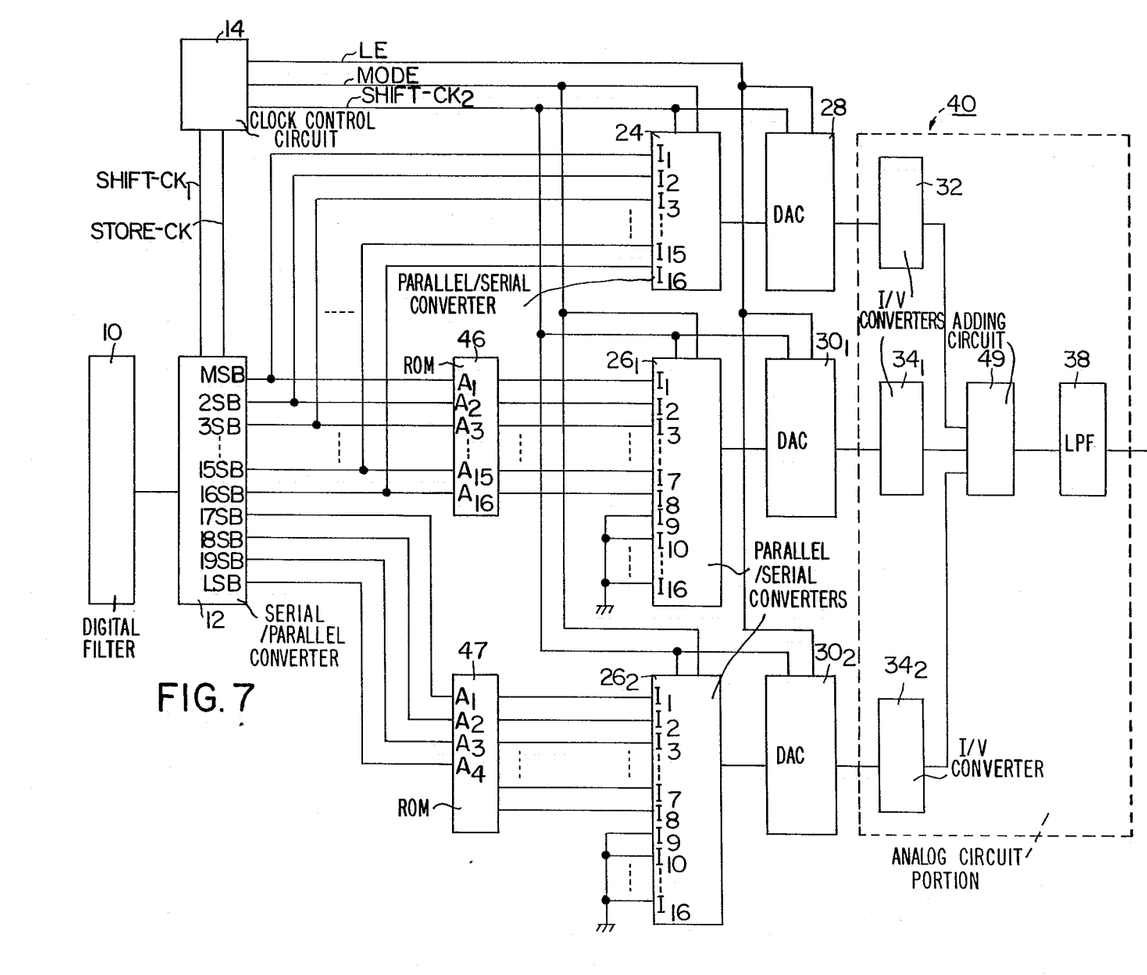

FIG. 7 shows another improvement. In FIG. 6, DAC 30 has converted the upper bit-output-error-correcting data as well as the lower-bit-output-approximate data. In the embodiment of FIG. 7, the upper-bit-output-error-correcting data are passed through a parallel/serial converter circuit $26_1$ and converted by a DAC $30_1$, while the lower-bit-output-approximate data are passed through a parallel/serial converter circuit $26_2$ and converted by a DAC $30_2$. Then, these outputs are passed through I/V converters $34_1$ and $34_2$, respectively, and, together with an output of an I/V converter 32, added to each other in an adding circuit 49.

Figure 8:
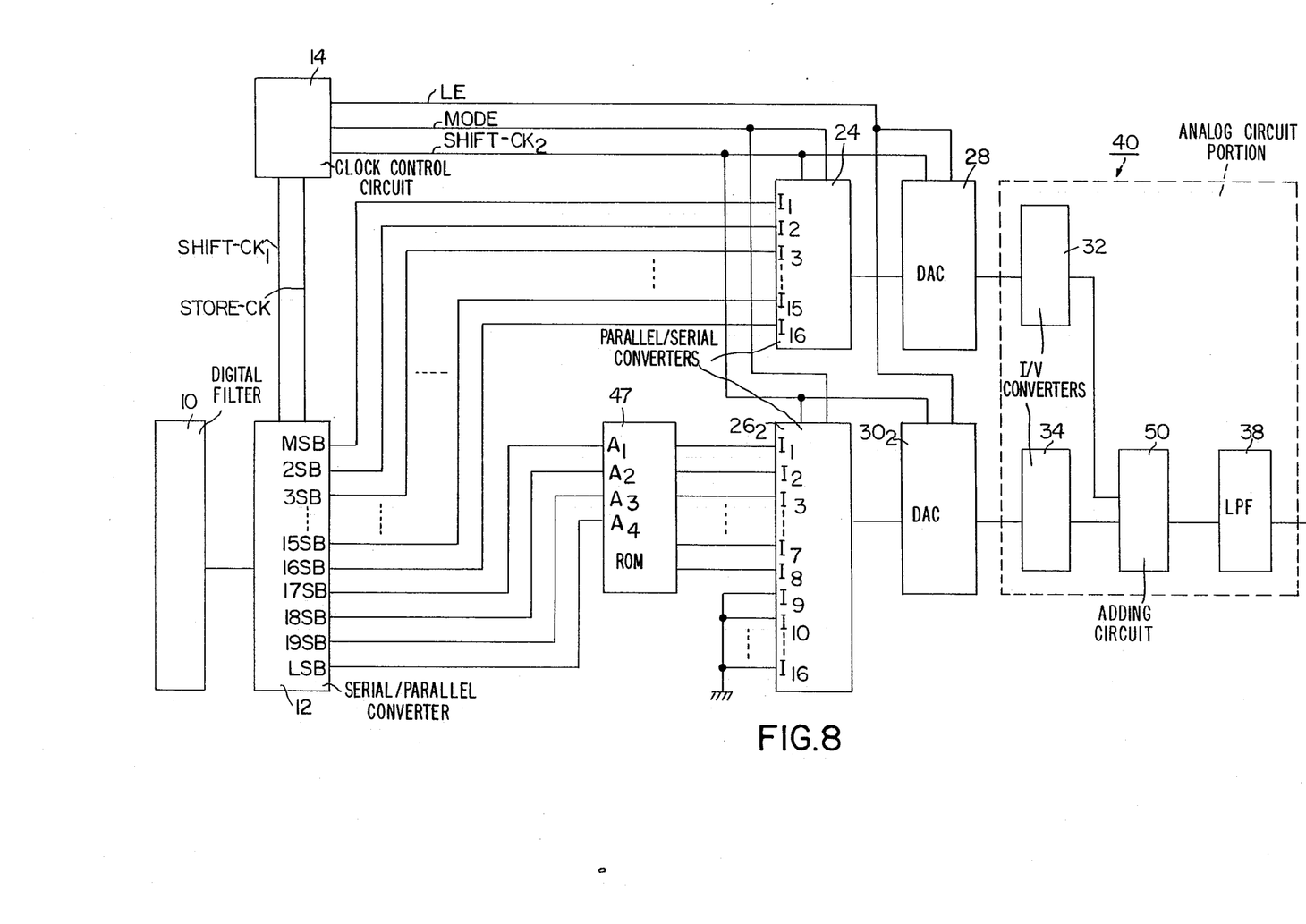

FIG. 8 shows still another embodiment that is applicable when a nonlinear error of a DAC 28 for upper bits is quite small. To increase the number of bits without correcting the output error of DAC 28, only the lower-bit-output-approximate data stored in a ROM 47 are passed through a parallel/serial converter circuit $26_2$ and converted by a DAC $30_2$.

With the arrangement of the digital/analog converting device of the invention, definite adjustment of an output gain of DAC 1 or 2 and an adding ratio of the analog adder 5 will not be needed. The device is not affected by thermal changes and aging, capable of achieving required digital/analog conversion with high accuracy. Processes such as data measuring, operation and ROM writing of the device can be automated so that the device is appropriate for mass production.

Although the invention has been described in conjunction with several specific embodiments thereof, it is to be understood that many modifications and variations may be made without departing from spirit and scope of the invention as defined in the appended claims. For example, although DACs employed in the embodiments illustrated have serial inputs to thereby require parallel/serial converter circuits, the converter circuits will not be needed if DACs accept parallel inputs. Although the upper-bit-output-error-correcting data are stored in ROM for all 16 bits of input data to provide conversion accuracy to a great extent, it will be practically sufficient that upper 10 bits, for example, of the input data are stored in ROM since DAC has in general larger output errors on the upper bit side. In such case, correction is made irrespective of bits 11SB to 16SB of the input data. The 20-bit input data are handled by DACs 28 and 30 of upper 16 bits and lower 4 bits, respectively, in the embodiments illustrated, which will not limit the invention. For example. DACs 28 and 30 may process upper 14 bits and lower 6 bits, respectively. An exclusive-use 9-bit DAC may be employed in place of DAC 30 having larger bits. The filtering activities performed by the analog circuit portion 40 is not directly concern the material features of the invention so that the number of the filtering stages may be changed upon necessity. If the case may be, the analog circuit portion 40 may not have filtering characteristics. The DC offset may be removed by an independent offset circuit, not by the capacitor $C_5$.

What is claimed is:

1. A digital/analog converting device comprising:
a first digital/analog converter for converting upper M bits of an input digital signal into a first analog signal;
storage means for receiving, as address data, at least a digital signal of lower N bits of the input digital signal to output lower-bit-output-approximate data of S (S>N) bits in response to the address data;
a second digital/analog converter for converting digital data at least including the S-bit lower-bit output-approximate data into a second analog signal; and
analog adding means for adding the first analog signal to the second analog signal at a predetermined ratio to output an added analog signal,
the S-bit lower-bit-output-approximate data to be outputted in response to the digital signal of lower N bits being set such that, when a level change of the added analog signal with respect to a change of an LSB of the upper M bits is $\Delta L$, a minimum step increase of the digital signal of lower N bits causes a level of the added analog signal to increase by about $\Delta L/2^n$.

2. A digital/analog converting device comprising:
a first digital/analog converter for converting upper M bits of an input digital signal into a first analog signal;
storage means for receiving, as first address data, a digital signal at least including a most significant bit of the upper M bits to output upper-bit-output-error-correcting data of predetermined bits in response to the first address data, and receiving, as second address data, a digital signal of lower N bits of the input digital signal to output lower-bit-output-approximate data of S (S>N) bits in response to the second address data;
digital adding means for adding the upper-bit-output-error-correcting data and the lower-bit-output-approximate data to each other;
a second digital/analog converter for converting an output from said digital adding means into a second analog signal; and
analog adding means for adding the first analog signal to the second analog signal at a predetermined ratio to output an added analog signal,
the upper-bit-output error correcting data to be outputted in response to the digital signal inclusive of the most significant bit being set such that the added analog signal outputted in response to the upper M bits has a required level, and the S-bit lower-bit-output-approximate data to be outputted in response to the digital signal of lower N bits being set such that, when a level change of the added analog signal with respect to a change of an LSB of the upper M bits is ΔL, a minimum step increase of the digital signal of lower N bits causes a level of the added analog signal to increase by about $\Delta L/2^N$.

3. A digital/analog converting device comprising:

a first digital/analog converter for converting upper M bits of an input digital signal into a first analog signal;

storage means for receiving, as address data, a first digital signal at least including a most significant bit of the upper M bits and a second digital signal of lower N bits of the input digital signal to output correction data of K (K>N) bits in response to the address data, a second digital/analog converter for converting the correction data outputted from said storage means into a second analog signal; and analog adding means for adding the first analog signal to the second analog signal at a predetermined ratio to output an added analog signal, the correction data being set such that the added analog signal has a required level in conformity to the input digital signal.

4. A digital/analog converting device comprising:

a first digital/analog converter for converting upper M bits of an input digital signal into a first analog signal;

storage means for receiving, as first address data, a digital signal at least including a most significant bit of the upper M bits to output upper-bit-output-error-correcting data of predetermined bits in response to the first address data, and receiving, as second address data, a digital signal of lower N bits of the input digital signal to output lower bit-output approximate data of S (S>N) bits in response to the second address data;

a second digital/analog converter for converting the upper bit-output-error-correcting data outputted from said storage means into a second analog signal;

a third digital/analog converter for converting the lower-bit-output-approximate data outputted from said storage means into a third analog signal; and analog adding means for adding the first, second and third analog signals to each other at a predetermined ratio to output an added analog signal;

the upper-bit-output-error-correcting data to be outputted in response to the digital signal inclusive of the most significant bit being set such that the added analog signal outputted in response to the upper M bits has a required level, and the S-bit lower-bit-output-approximate data to be output&ed in response to the digital signal of lower N bits being set such that, when a level change of the added analog signal with respect to a change of an LSB of the upper M bits is ΔL, a minimum step increase of the digital signal of lower N bits causes a level of the added analog signal to increase by about $\Delta L/2^n$.

* * * * *

UNITED STATES PATENT AND TRADEMARK OFFICE
CERTIFICATE OF CORRECTION

PATENT NO. : 4,963,870
DATED : October 16, 1990
INVENTOR(S) : Hajime Obinata

It is certified that error appears in the above-identified patent and that said Letters Patent is hereby corrected as shown below:

Column 5, line 2, "(Dn-1)" should be --(Dn+1)--;

line 28, "SHIFT-CK" should be --SHIFT-$CK_2$--.

Column 6, line 37, "Vb" should be --Vb'--.

Column 7, line 46, after "DAC $30_2$." insert

Column 8, line 41, "$\Delta L/2^n$" should be --$\Delta L/2^N$--.

Column 10, line 26, "put&ed" should be --putted--;

line 32, "$\Delta L/2^n$" should be --$\Delta L/2^N$--.

Signed and Sealed this

Twelfth Day of January, 1993

*Attest:*

DOUGLAS B. COMER

*Attesting Officer*  *Acting Commissioner of Patents and Trademarks*